US008919279B1

(12) United States Patent
Bourez et al.

(10) Patent No.: US 8,919,279 B1
(45) Date of Patent: Dec. 30, 2014

(54) PROCESSING SYSTEM HAVING MAGNET KEEPER

(75) Inventors: Allen J. Bourez, San Jose, CA (US); Robert D. Hempstead, Los Gatos, CA (US); Jinliang Chen, Fremont, CA (US); Yew Ming Chiong, San Jose, CA (US)

(73) Assignee: WD Media, LLC, San Jose, CA (US)

( * ) Notice: Subject to any disclaimer, the term of this patent is extended or adjusted under 35 U.S.C. 154(b) by 639 days.

(21) Appl. No.: 12/895,653

(22) Filed: Sep. 30, 2010

(51) Int. Cl.
| C23C 16/00 | (2006.01) |
| C23F 1/00 | (2006.01) |
| H01L 21/306 | (2006.01) |

(52) U.S. Cl.
USPC ............. 118/723 R; 156/345.42; 156/345.46; 118/723 MR; 118/723 FI; 118/723 FE; 118/723 FB

(58) Field of Classification Search
USPC ............. 118/723 R, 723 FI, 723 EB, 723 FE; 315/111.21, 111.41, 111.71, 111.81; 250/423 R See application file for complete search history.

(56) References Cited

U.S. PATENT DOCUMENTS

| 4,620,081 | A | * | 10/1986 | Zeren ........................ 219/121.15 |
| 4,673,477 | A | * | 6/1987 | Ramalingam et al. ... 204/192.38 |
| 4,710,283 | A | * | 12/1987 | Singh et al. ............. 204/298.01 |
| 4,911,784 | A | * | 3/1990 | Hensel et al. .............. 204/192.3 |
| 5,099,790 | A | * | 3/1992 | Kawakami ............. 118/723 MR |
| 5,399,253 | A | * | 3/1995 | Grunenfelder ............. 204/298.2 |
| 5,576,600 | A | * | 11/1996 | McCrary et al. ......... 315/111.81 |
| 5,646,476 | A | * | 7/1997 | Aston ......................... 313/359.1 |
| 6,203,862 | B1 |   | 3/2001 | Bluck et al. |
| 6,208,080 | B1 | * | 3/2001 | King et al. ............... 315/111.41 |
| 6,245,190 | B1 | * | 6/2001 | Masuda et al. ........... 156/345.46 |
| 6,271,529 | B1 | * | 8/2001 | Farley et al. .............. 250/423 R |
| 6,394,025 | B1 | * | 5/2002 | Sakemi et al. ........... 118/723 VE |
| 6,911,779 | B2 | * | 6/2005 | Madocks ................. 315/111.21 |
| 7,259,378 | B2 | * | 8/2007 | Madocks ................... 250/423 R |
| 2007/0026161 | A1 | * | 2/2007 | Madocks ....................... 427/569 |
| 2012/0025710 | A1 | * | 2/2012 | Klyuev et al. ............ 315/111.91 |

* cited by examiner

Primary Examiner — Rakesh Dhingra

(57) ABSTRACT

A processing system for and a method of producing ions inside a process chamber and shielding the ions from a magnetic field by directing the magnetic field through a magnet keeper is described.

18 Claims, 14 Drawing Sheets

SECTION A-A

PROCESSING SYSTEM HAVING MAGNET KEEPER

TECHNICAL FIELD

Embodiments described herein relate to the field of disk processing systems, and, in particularly, a processing system having a magnet keeper.

BACKGROUND

Processing substrates with plasma is widely used in a broad range of industries. A disk processing system using a plasma-enhanced chemical vapor deposition (PECVD) source, i.e. a PECVD system, is one example of a plasma-based enabling technology that may be used to coat the surface of media storage disks with a protective layer of carbon.

FIG. 1A illustrates a partial plan view of one type of processing system. The process system illustrated in FIG. 1A is a PECVD processing system known as the NCT Mark V Process Station (the "NCT unit"), which is manufactured by Intevac, Inc. of Santa Clara, Calif. FIG. 1B illustrates a conceptual operation of the NCT unit. During operation of the NCT unit, neutral gas molecules 100 enter the chamber 110 from a gas source 114 located behind gas diffuser 118. A filament 119 emits electrons 102 toward anode 116 that excite the neutral gas molecules 100 to generate plasma. Ions 104 are deposited onto disk 106 to coat the substrate surface with a protective diamond like carbon (DLC) coating.

The NCT unit design inhibits the backflow of plasma from chamber 110 into gas source 114 using a permanent magnet 112 positioned within an enclosure 120. The permanent magnet 112 is formed from NdFeB 38 magnetic material having a diameter of 1.0 inch and a length of 2.0 inches. The permanent magnet 112 generates a magnetic field that defines flux path 122. Flux path 122 moves through gas diffuser 118 in a direction that repels electrons 102 and ions 104 from entering where they might cause undesirable pre-ignition of neutral gas molecules 100.

While the NCT unit inhibits the backflow of electrons 102 and ions 104, the magnetic field may also distort ion distribution within chamber 110. The magnetic field may enter the chamber 110 directly by passing around the gas diffuser 118, which is spaced a distance of about 3.22 inches from the permanent magnet 112 and has a thickness of about 0.1 inch. Alternatively, the magnetic field may enter the chamber 110 indirectly by straying as it travels between the gas diffuser 118, which has a diameter of 2.25 inches, and the enclosure 120, which has a diameter of 8.00 inches. Magnetic field that enters the chamber 110 may distort ion distribution therein.

FIG. 1C illustrates the negative impact that ion distortion within chamber 110 may have on the carbon coating process. Ion distortion generates coating thickness variation through uneven ion distribution and unwanted ion deposition onto anode 116 and chamber magnets 124, which may lead to escalating variation in coating thickness variation. As a result, standard deviation in carbon coating thickness across the entire disk face may gradually increase from a cycle-start standard deviation 130 of, for example, about 5% of nominal substrate coating thickness at the beginning of a production cycle to a cycle-stop standard deviation 132 of, for example, about 10% of nominal substrate coating thickness at the end of a production cycle. Increasing coating variability ultimately translates into degraded performance of the media storage disk.

BRIEF DESCRIPTION OF THE DRAWINGS

The present disclosure is illustrated by way of example, and not by way of limitation, in the figures of the accompanying drawings.

DETAILED DESCRIPTION

Embodiments of a method are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding. In other instances, well-known manufacturing processes and equipment have not been described in particular detail to avoid unnecessarily obscuring the claimed subject matter. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment. Furthermore, the particular features, structures, materials, or characteristics may be combined in any suitable manner in one or more embodiments.

Figure 2:
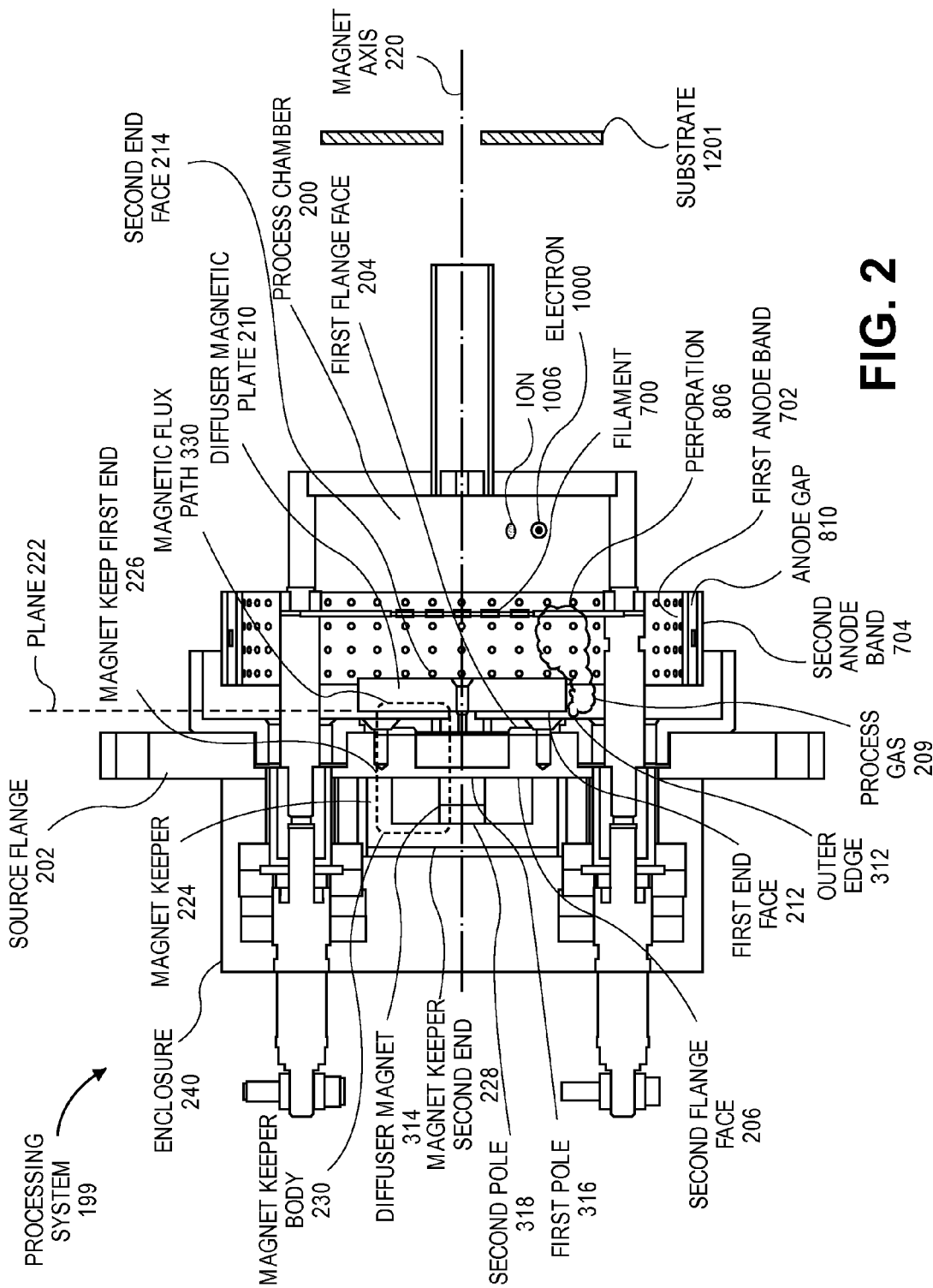
FIG. 2 is a partial plan view illustrating a processing system according to one embodiment.

FIG. 2 is a partial plan view illustrating a processing system according to one embodiment. In this embodiment, processing system 199 is a PECVD system, for example, used to apply a carbon overcoat to a substrate 1201 such as a magnetic recording, or media, disk. The processing system 199 includes a process chamber 200 enclosing a filament 700 and first and second anode bands 702, 704 that operate to collect electrons 1000. The electrons 1000 are used to excite a process gas 209, thereby producing a plasma having ions 1006 within the process chamber 200. Subsequently, ions 1006 may be deposited onto a surface of the substrate 1201 to form a carbon coating thereon.

Prior to excitation, the process gas 209 may be flowed into the process chamber 200 across a diffuser magnetic plate 210. The diffuser magnetic plate 210 may separate the process chamber 200 from a diffuser magnet 314. The diffuser magnet 314 generates a magnetic field (not shown) that defines a magnetic flux path 330, which emanates from a first pole 316 toward the diffuser magnetic plate 210. This magnetic field may be used to inhibit the backflow of electrons 1000 and ions 1006 into the region that process gas 209 flows into process chamber 200 by repelling electrons 1000 and ions 1006 as the magnetic flux path 330 is redirected through the diffuser magnetic plate 210 toward an outer edge 312. The magnetic field may be redirected from the outer edge 312 of the diffuser magnetic plate 210 into a first end 226 of a magnet keeper 224. The magnet keeper 224 carries the magnetic field away from the process chamber 200 and toward a second pole 318 of the diffuser magnet 314.

The PECVD processing of substrate 1201 is sensitive to plasma distribution within chamber 200, and more particularly, the distortion of ions 1006 by the magnetic field within process chamber 200 may cause a non-uniform carbon thickness on the coated substrate 1201. Therefore, shielding ions 1006 from the magnetic field may produce a reduction in carbon thickness variation on substrate 1201. Several factors may contribute to interplay between ions 1006 and the magnetic field. The design of the diffuser magnet 314, and more particularly, the material, shape, and size of the diffuser magnet 314, affects the strength of the magnetic field. The design of the diffuser magnetic plate 210, and more particularly, the thickness of the diffuser magnetic plate 210, affects the leakage of magnetic field into the process chamber 200 as it travels from the diffuser magnet 314. The relation of the diffuser magnetic plate 210 to the diffuser magnet 314 affects whether the magnetic field strays into the process chamber 200 as it travels between the diffuser magnet 314 and the diffuser magnetic plate 210. The relation of the magnet keeper 224 to the diffuser magnetic plate 210 affects whether the magnetic field is efficiently confined to the region of the diffuser magnetic plate 314. By controlling one or more of these factors, ions 1006 may be shielded from the magnetic field to reduce the variation in carbon coating thickness on the substrate 1201. In the following embodiments, these and other factors are addressed more particularly and in accordance with the operational principles set forth herein.

In one embodiment of the processing system 199, the process chamber 200 may be abutted by, or disposed near, a source flange 202 including a first flange face 204 and a second flange face 206. The first flange face 204 may appose the process chamber 200 and the second flange face 206 may face away from the process chamber 200. The source flange 202 may further include channels (not shown) that enable process gas 209 to flow into the process chamber 200. These channels may be lumens that pass between the first flange face 204 and the second flange face 206. Alternatively, the channels may be grooves in the flange faces that create passages when the flange faces are disposed against a face of a mating component (not shown). Alternatively, the channels may be any type of pathway that permits the process gas 209 to be conveyed into the process chamber 200.

The process gas 209 flows into the process chamber 200 across a diffuser magnetic plate 210 disposed adjacent to the source flange 202. The diffuser magnetic plate 210 includes a first end face 212 that may appose the first flange face 204, and may further include a second end face 214 that may be located within the process chamber 200. Together, the second end face 214 and the first flange face 204 define a process chamber wall in that portions of each may be placed in contact with ions that are produced within the process chamber 200 during operation of the processing system 199.

Figure 3:
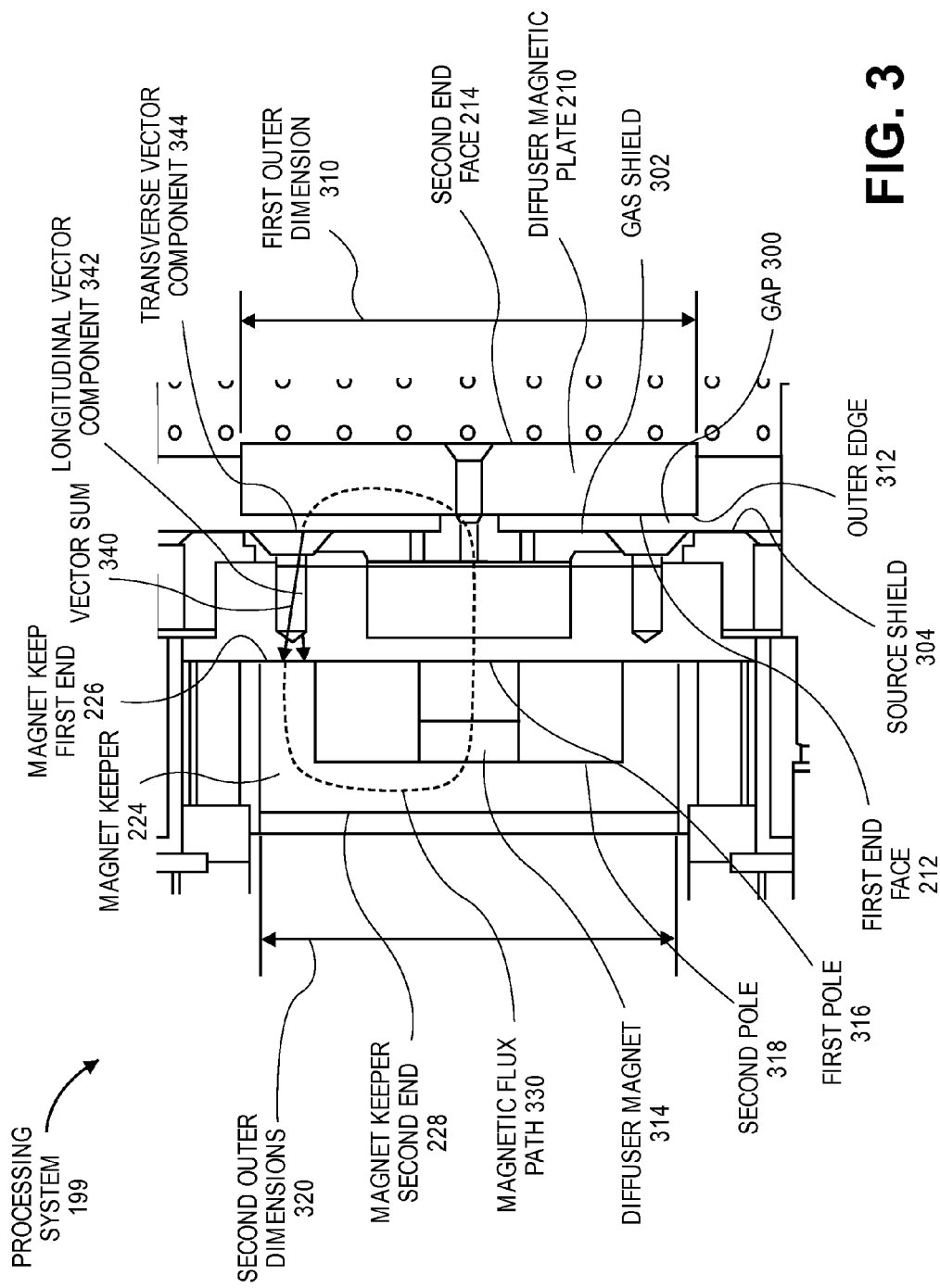
FIG. 3 is an enlarged partial plan view illustrating a processing system according to one embodiment.

The area that exists between the first flange face 204 of the source flange 202 and the first end face 212 of the diffuser magnetic plate 210 is not within the process chamber 200. However, this area may form part of the path that a process gas 209 traverses while entering the process chamber 200. The area between the first flange face 204 and the first end face 212 defines a gap 300 between the source flange 202 and the diffuser magnetic plate 210. Furthermore, the gap 300 may, alternatively, exist between the diffuser magnetic plate 210 and an alternative flange, plate, and/or shield. For example, as shown in FIG. 3, the gap 300 may exist between the diffuser magnetic plate 210 and a gas shield 302, or between the diffuser magnetic plate 210 and a source shield 304. Although the gap 300 may measure any distance that permits adequate shielding of ions within the process chamber 200 as described further below. In one embodiment, the gap 300 is between 0.03 to 0.25 inches. Alternatively, the gap 300 may be between 0.10 to 0.15 inches.

The diffuser magnetic plate 210 may have various sizes and shapes. For example, in one embodiment, the diffuser magnetic plate 210 may be formed as a circular disk. In an alternative embodiment, the diffuser magnetic plate 210 may be formed as a plate having a cross-sectional geometry in any of a rectangular, triangular, polygonal, or another geometric shape.

Regardless of the magnetic plate shape, the diffuser magnetic plate 210 has a thickness between the first end face 212 and the second end face 214. In one embodiment, for example, this thickness may be in the range of about 0.1 to 1.0 inches. More particularly, the thickness may be in the range of 0.2 to 0.5 inches. In a particular embodiment, the thickness may be 0.35 inches. Although these ranges are set out as examples, the thickness of the diffuser magnetic plate 210 may be more or less than this range in accordance with the operational principles set forth below. More specifically, the thickness of the diffuser magnetic plate 210 correlates with the strength of a diffuser magnet 314, dismissing other system variables such as distance between the diffuser magnetic plate 210 and the diffuser magnet 314. Thus, as the strength of the diffuser magnet 314 increases, so may the thickness of the diffuser magnetic plate 210 increase to ensure that the magnetic field is adequately shielded from ions within the process chamber 200 as described below.

FIG. 3 is an enlarged partial plan view illustrating an embodiment of a processing system 199. The first end face 212 may define an outer edge 312 of the diffuser magnetic plate 210. For example, in an embodiment where the diffuser magnetic plate 210 has a circular disk geometry, the outer edge 312 has a circular shape. The outer edge 312 defines a first outer dimension 310 that measures from one point along the outer edge 312 to another point along the outer edge 312. In an embodiment with a diffuser magnetic plate 210 including a circular disk geometry, the first outer dimension 310 may be a diameter. For example, for a circularly formed diffuser magnetic plate 210, the first outer dimension 310 may be a diameter in a range of 1.5 to 3.0 inches. In a particular embodiment, for a circularly formed diffuser magnetic plate 210, the first outer dimension 310 may be a diameter of 2.25 inches.

In an alternative embodiment, a non-circular diffuser magnetic plate 210 may define the first outer dimension 310. In the case of a diffuser magnetic plate 210 having a rectangular geometry, the first outer dimension 310 may be a width or height of the rectangle, or even a distance measured from one vertex of the rectangle to another vertex of the rectangle. More generally, the first outer dimension 310 may be any distance measured between two points along the outer edge 312 and need not be either a maximum or a minimum dimension of the outer edge 312.

The diffuser magnetic plate 210 may be formed from a soft magnetic material such as steels, electrical steels, iron-nickel alloys, iron-cobalt alloys, ferrites, and/or amorphous metals. For example, the diffuser magnetic plate 210 may be formed from grade 410 stainless steel. Alternatively, the diffuser magnetic plate 210 may be formed from any material that exhibits a relative permeability greater than or equal to that of grade 410 stainless steel. In a particular embodiment, any material with a relative permeability greater than or equal to a value of about 100 may be suited to fabrication of the diffuser magnetic plate 210. In an alternative embodiment, the diffuser magnetic plate 210 may be plated with vacuum compatible materials such as nickel.

Both the source flange 202 and the diffuser magnetic plate 210 may separate a diffuser magnet 314 from the process chamber 200. The diffuser magnet 314 may include a first pole 316 and a second pole 318. A second flange face 206 of the source flange 202 may oppose the first pole 316 of the diffuser magnet 314. The first pole 316 may be the south pole of a permanent magnet and the second pole 318 may be the north pole of a permanent magnet, or vice versa.

The diffuser magnet 314 may be formed in a range of alternative sizes and shapes. For example, the diffuser magnet 314 may be formed having a disc shape, a rectangular shape, a hollow disc shape, a polygonal shape, or any other shape that is used in the art of magnet design and manufacturing. In any alternative shape, the diffuser magnet 314 may also include a length and an effective diameter. For example, in the case of a disc-shaped diffuser magnet 314, the magnet geometry may have a length between the diffuser magnet 314 first and second pole 318 and an effective diameter equal to the true diameter of the circular cross-section. However, the effective diameter may be defined differently for various other shapes. For example, a rectangular shaped diffuser magnet 314, may have an effective diameter equal to the width or the height of a cross-sectional geometry of the rectangular shaped diffuser magnet 314. Alternatively, the effective diameter for a rectangular shaped diffuser magnet 314 may be defined by the equation: $D_e = 2*w*h/(w+h)$, where $D_e$ is the effective diameter, w is the rectangle width, and h is the rectangle height.

In accordance with an embodiment of a processing system 199, the length of the diffuser magnet 314, measured between the first and second poles, may be in a range of 0.1 to about 2.0 inches. More particularly, the length of the diffuser magnet 314 may be in a range of 0.3 to 1.0 inches. In one particular embodiment, the length of the diffuser magnet 314 is 0.5 inches.

In one embodiment of processing system 199, the effective diameter of the diffuser magnet 314 may be in a range of 0.1 to 1.5 inches. More particularly, the effective diameter of the diffuser magnet 314 may be in the range of 0.2 to 1.0 inches. In one particular embodiment, the effective diameter of the diffuser magnet 314 may be 0.5 inches.

The diffuser magnet 314 may be formed from a variety of magnetic materials. For example, the diffuser magnet 314 may be formed from materials such as neodymium-iron-boron alloys, samarium-cobalt alloys, ceramics, hard ferrites, and aluminum-nickel-cobalt alloys. By way of example, the diffuser magnet 314 may be formed from a ceramic material such as Ceramic 8 ceramic permanent magnetic material. Alternatively, the diffuser magnet 314 may be formed from a SmCo 18 samarium-cobalt alloy permanent magnetic material. In one particular embodiment, the diffuser magnet 314 may be formed from a material with a maximum energy product less than or equal to 40 MGOe.

In addition to the various magnet embodiments described above, the diffuser magnet 314 may be an alternative magnet type. For example, the diffuser magnet 314 may be an electromagnet-type magnet instead of a permanent-type magnet. Thus, the diffuser magnet 314 can be formed from any magnet size, material, or type that generates a magnetic field that may be adequately shielded from distorting ions within the process chamber 200 as described below.

In an alternative embodiment, the distance between the first pole 316 of the diffuser magnet 314 and the first end face 212 of the diffuser magnetic plate 210 may be adjusted as a means to control the shielding of magnetic field. In one example, the distance between the first pole 316 of the diffuser magnet 314 and the first end face 212 of the diffuser magnetic plate 210 may be in a range of about 0.50 to about 1.50 inches. Alternatively, the distance may be in a range of 0.70 to 1.10 inches. In a particular embodiment, the distance may be 0.72 inches.

Referring back to FIG. 2, the components of the system provide reference geometry useful in describing the processing system 199. The diffuser magnet 314 defines a magnet axis 220 that runs through the first pole 316 and the second pole 318 of the magnet and projects forward into the process chamber 200. The magnet axis 220 defines a longitudinal direction in the system. The magnet axis 220 may, but need not, run through a central axis of the diffuser magnetic plate 210. The diffuser magnetic plate 210 defines a plane 222 parallel to, and at least partially encompasses, the first end face 212 of the diffuser magnetic plate 210. The plane 222 defines a transverse direction in the system. Therefore, the plane 222 and the axis are substantially orthogonal to each other, though they need not be precisely perpendicular.

In one embodiment, the system may further include a magnet keeper 224 that partially encloses the diffuser magnet 314. The magnet keeper 224 may be formed in a variety of shapes, but in one embodiment, the magnet keeper 224 may include a cross-sectional geometry that is generally C-shaped. Thus, the magnet keeper 224 may include a magnet keeper first end 226 that defines the ends of the C-shape and a magnet keeper second end 228 that defines the back, or cross bar, of the C-shape. The magnet keeper 224 may further include a magnet keeper body 230 that extends between the magnet keeper first end 226 and the magnet keeper second end 228. For example, the distance between the magnet keeper first end 226 and the magnet keeper second end 228 may be in a range of about 0.2 to about 5.0. More particularly, the distance between the magnet keeper first end 226 and the magnet keeper second end 228 may be in a range of 0.5 to 1.0 inches. In a particular embodiment, the distance between the magnet keeper first end 226 and the magnet keeper second end 228 may be 0.75 inches. This distance may vary in accordance with other embodiments, while still maintaining a continuous path between the magnet keeper first end 226 and the magnet keeper second end 228 through the magnet keeper body 230.

Referring again to FIG. 3, in accordance with an embodiment of a processing system 199, the magnet keeper first end 226 may define a second outer dimension 320 that measures from one point on the magnet keeper first end 226 to a second point on the magnet keeper first end 226. In an embodiment where the magnet keeper 224 is a cylinder, the magnet keeper 224 may have a circular cross-sectional area defined by an outer circular edge and an inner circular edge. For example, the outer circular edge may have a diameter of 2.00 inches and the inner circular edge may have a diameter of 1.50 inches. The first and second points may lie anywhere within the area between the outer and inner circular edges. Thus, the second outer dimension 320 may be a maximum diameter as measured from a point along the outer circular edge to a diametrically opposed point on the same edge, i.e. the second outer dimension 320 may be 2.00 inches. Alternatively, the second outer dimension 320 may be a minimum diameter as measured from a point along the inner circular edge to a diametrically opposed point on the same edge, i.e. the second outer dimension 320 may be 1.50 inches. Further yet, the second outer dimension 320 may be between any two points on the magnet keeper first end 226, e.g. the second outer dimension 320 may be 1.51, 1.75, or 1.75 inches in several alternative embodiments. Thus, in an alternative embodiment, the second outer dimension 320 may be within the surface area of the magnet keeper first end 226 rather than on an edge of the magnet keeper first end 226. Furthermore, in yet another alternative embodiment in which the magnet keeper first end 226 is non-circular, such as a rectangle, the second outer dimension 320 may define a width or height of the rectangular or non-circular magnet keeper first end 226.

The magnet keeper first end 226 geometry may correspond to the geometry of the diffuser magnetic plate 210. For example, in one embodiment, the second outer dimension 320 defined by the magnet keeper first end 226 may be less than or equal to thrice the first outer dimension 310 defined by the diffuser magnetic plate 210. Thus, in an embodiment in which the diffuser magnetic plate 210 defines a first outer dimension 310 of 2.25 inches, the second outer dimension 320 may be less than or equal to 6.75 inches. In an alternative embodiment, the second outer dimension 320 may be less than or equal to twice the first outer dimension 310 defined by the diffuser magnetic plate 210. Thus, in an embodiment in which the diffuser magnetic plate 210 defines a first outer dimension 310 of 2.25 inches, the second outer dimension 320 may be less than or equal to 4.50 inches. In additional embodiments, the dimensions and relation between the diffuser magnetic plate 210 and the magnet keeper 224 may be modified to ensure that magnetic field travels between those components rather than straying into the process chamber 200.

In an alternative embodiment, the magnet keeper 224 may be formed from multiple components. For example, the magnet keeper 224 may include one component that forms the horizontal bars on the C-shape and a second component that forms the back, or cross bar, of the C-shape. These first and second components may be bonded, fastened, or otherwise coupled with one another in order to produce a single magnet keeper 224. Thus, the magnet keeper 224 may include a magnet keeper body 230 that forms a continuous path between the magnet keeper first end 226 and the magnet keeper second end 228 through the first and second components. In another alternative embodiment, the magnet keeper 224 may not be C-shaped and/or may have more than two components.

In an alternative embodiment, the magnet keeper 224 may include a magnet keeper second end 228 that may not be separated from the source flange 202 by the diffuser magnet 314. In accordance with such an embodiment, the magnet keeper 224 may be formed in a cylindrical shape having an inner diameter greater than the diffuser magnet 314 outer diameter. In the present embodiment, the diffuser magnet 314 may be considered partially enclosed by the cylindrical magnet keeper 224 because a portion of the diffuser magnet 314, when viewed in the longitudinal direction, is within the profile of the magnet keeper 224. Thus, the partial enclosure of the diffuser magnet 314 by the magnet keeper 224 may be interpreted broadly so that no portion of the magnet keeper 224 need be aligned with a portion of the diffuser magnet 314 in order for the diffuser magnet 314 to be enclosed by the magnet keeper 224. In one embodiment, if the magnet axis 220 is enclosed by the profile of the magnet keeper 224, then the diffuser magnet 314 may be considered enclosed by the magnet keeper 224.

The magnet keeper 224 may be formed from a soft magnetic material such as steels, electrical steels, iron-nickel alloys, iron-cobalt alloys, ferrites, and/or amorphous metals. For example, the magnet keeper 224 may be formed from grade 410 stainless steel. Alternatively, the magnet keeper 224 may be formed from any material that exhibits a relative permeability greater than or equal to that of grade 410 stainless steel. In a particular embodiment, any material with a relative permeability greater than or equal to a value of about 100 may be suited to fabrication of the magnet keeper 224.

Referring again to FIG. 2, in one embodiment of processing system 199, the magnet keeper 224 may be partially enclosed by an enclosure 240. The enclosure 240 may be coupled to the source flange 202 or it may be otherwise suspended around the magnet keeper 224. The enclosure 240 may be formed from a material less magnetically permeable than the magnet keeper 224 material. For example, the enclosure 240 may be formed from aluminum sheet metal. Alternatively, the enclosure 240 may be formed from a material at least as magnetically permeable as the magnet keeper 224 material. In one embodiment, the enclosure 240 may be offset from the magnet keeper 224 by a distance great enough to inhibit any magnetic field resident in the magnet keeper 224 from jumping into the enclosure 240. However, in an alternative embodiment, the enclosure 240 may be immediately adjacent to the magnet keeper 224 or only slightly spaced apart from the magnet keeper 224. In additional embodiments, the enclosure 240 material or the relation of the enclosure 240 to the magnet keeper 224 may be modified to ensure that it is removed from the magnetic field path to inhibit magnetic field from straying into the process chamber 200.

Figure 4:
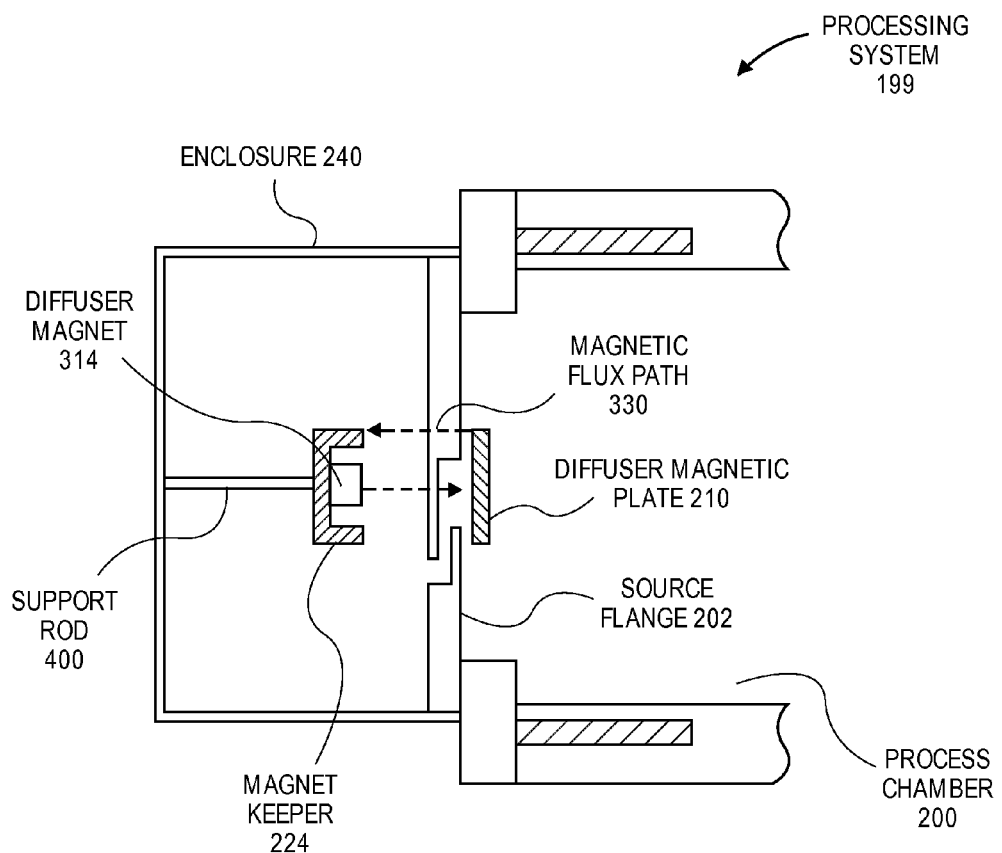
FIG. 4 is a partial plan view illustrating an alternative embodiment of a processing system.

FIG. 4 is a partial plan view illustrating a processing system according to an alternative embodiment of the present invention. The magnet keeper first end 226 may be separated from the source flange 202 and the enclosure 240. The magnet keeper 224 may be suspended within the enclosure 240 by a support element such as a support rod 400 that attaches between the enclosure 240 and the magnet keeper second end 228. The support rod 400 allows the magnet keeper 224 to be suspended within the enclosure 240 with the magnet keeper first end 226 not coupled to the source flange 202.

Figure 5:
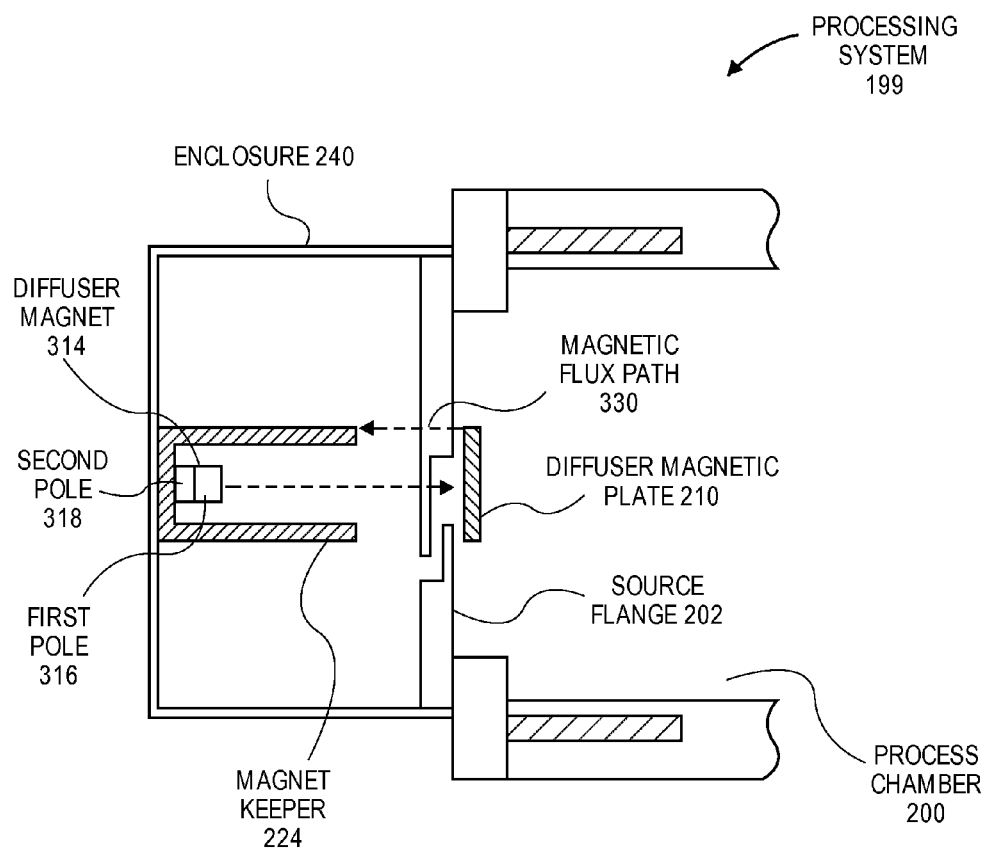
FIG. 5 is a partial plan view illustrating yet another embodiment of a processing system.

FIG. 5 is a partial plan view illustrating yet another embodiment of a processing. The magnet keeper 224 may be coupled to the enclosure 240 near the magnet keeper second end 228 and the magnet keeper first end 226 may not be coupled to the source flange 202. The diffuser magnet 314 may be coupled to the magnet keeper 224 near the magnet keeper second end 228 at the second pole 318 of the diffuser magnet 314.

The magnet keeper first end 226 may be closer to, as close to, or farther from the process chamber 200 than the diffuser magnet 314. Also, the magnet keeper first end 226 may be closer to, as close to, or farther from the process chamber 200 than the first pole 316 or the second pole 318 of the diffuser magnet 314. For example, in an alternative embodiment, the magnet keeper second end 228 may be coupled to the enclosure 240 at a location furthest from the process chamber 200.

The magnet keeper body 230 may extend toward the source flange 202, terminating in magnet keeper first end 226, and the magnet keeper first end 226 may be spaced apart from the source flange 202. However, the diffuser magnet 314 may be disposed in a location or be sized and configured such that the first pole 316 of the diffuser magnet 314 may be nearer to the process chamber 200 than the magnet keeper first end 226. For example, the first pole 316 of the diffuser magnet 314 may be coupled to the source flange 202 and the second pole 318 of the diffuser magnet 314 may be suspended apart from the magnet keeper 224.

In an alternative embodiment, the diffuser magnet 314 may be disposed in a location or be sized and configured such that the first pole 316 of the diffuser magnet 314 may be farther from the process chamber 200 than the magnet keeper first end. For example, the magnet keeper first end 226 may be coupled to the second flange face 206 of the source flange 202 and the magnet keeper first end 226 may be spaced apart from the second flange face 206 by a spacer, such as a block formed from Teflon (not shown), or by an air gap.

In yet another alternative embodiment, the second pole 318 of the diffuser magnet 314 may be coupled to the magnet keeper 224 and the first pole 316 of the diffuser magnet 314 may extend to a point nearer to the process chamber 200 than the magnet keeper first end 226. In additional embodiments, the location of the magnet keeper 224 relative to the diffuser magnet 314 may be alternatively modified to further promote shielding of magnetic field from entering the process chamber 200.

Referring back to FIG. 3, a magnetic flux path 330 defined by a magnetic field is generated by the diffuser magnet 314. The magnetic flux path 330 is represented by a dotted line path that exits the first pole 316 of the magnet in the longitudinal direction along the magnet axis 220. The magnetic flux path 330 traverses through the source flange 202 into the diffuser magnet plate 210. As the magnetic flux path 330 enters the diffuser magnetic plate 210, the increased magnetic permeability of the diffuser magnetic plate 210, as compared to the adjacent space, causes the magnetic field to conduct through the diffuser magnetic plate 210 in a generally transverse direction along the first end face 212 of the diffuser magnetic plate 210. Thus, the magnetic field shunts toward the outer edge 312 of the diffuser magnetic plate 210.

The magnetic field may exit the diffuser magnetic plate 210 in the vicinity of the outer edge 312 of the diffuser magnetic plate 210 and travel toward the magnet keeper first end 226. This tendency to enter the magnet keeper 224 rather than disperse elsewhere is promoted by the increased magnetic permeability of the magnet keeper 224 as compared to the adjacent space. The path between the diffuser magnetic plate 210 and the magnet keeper 224 may define a curvilinear magnetic flux path 330. The curvilinear magnetic flux path 330 between the exit point from the diffuser magnetic plate 210 and the entrance point into the magnet keeper 224 may further define a linear vector sum 340. The linear vector sum 340 may be further decomposed into a longitudinal vector component 342 directed in the longitudinal direction and a transverse vector component 344 directed in the transverse direction.

The vector components may correlate closely with the first outer dimension 310 and the second outer dimension 320. For example, when the first outer dimension 310 and the second outer dimension 320 are equal, the magnetic flux path 330 may travel between the outer edge 312 and the magnet keeper first end 226 in a substantially longitudinal direction. Thus, the magnitude of the longitudinal vector component 342 will nearly equal the magnitude of the vector sum 340 and the magnitude of the transverse vector component 344 will nearly equal zero. Conversely, when the first outer dimension 310 is much smaller than the second outer dimension 320, the magnitude of the transverse vector component 344 will nearly equal the magnitude of the vector sum 340 and the magnitude of the longitudinal vector component 342 will nearly equal zero.

The ratio between the magnitude of the longitudinal vector component 342 and the magnitude of the transverse vector component 344 is inversely proportional to the likelihood of magnetic field traveling into the process chamber 200. When the ratio is larger, i.e., when the longitudinal vector component 342 is much larger than the transverse vector component 344, then the likelihood of magnetic flux travelling into the process chamber 200 is lowest. In one embodiment, this ratio may be, for example, greater than 0.1 in order to promote magnetic field flow from the diffuser magnetic plate 210 into the magnet keeper 224. Alternatively, the ratio may be greater than 0.3 in order to further promote the magnetic field flow from the diffuser magnetic plate 210 into the magnet keeper 224. In a particular embodiment, the ratio may be greater than 1.0 in order to further promote the magnetic field flow from the diffuser magnetic plate 210 into the magnet keeper 224.

Figure 6:
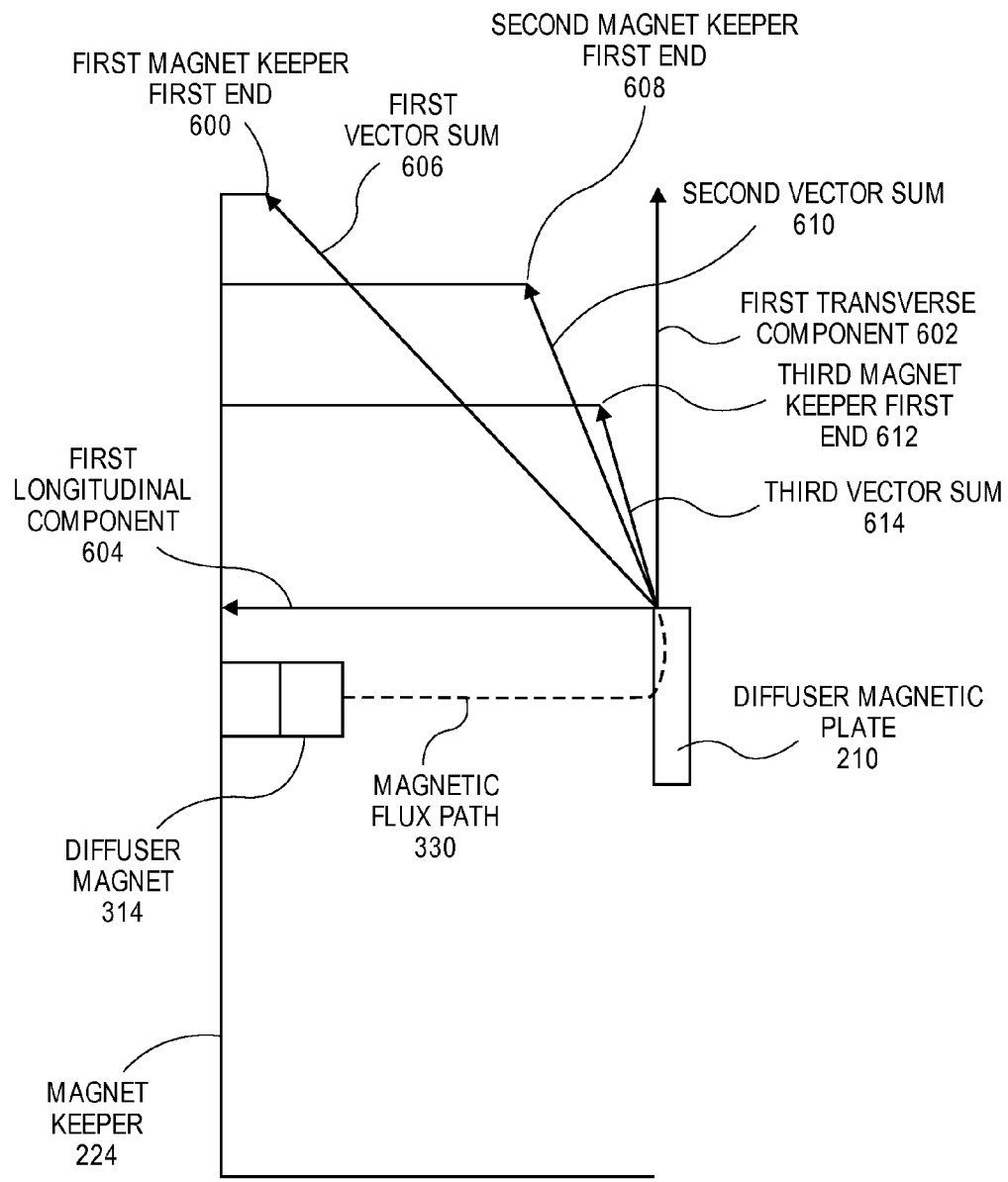
FIG. 6 is a diagram illustrating a conceptual operation of a processing system according to one embodiment.

FIG. 6 is a diagram illustrating different vector sums of the magnetic flux path in the processing system according to one embodiment. The vector sum 340 may be modified not only due to a change in the first outer dimension 310 or second outer dimension 320, as measured across the outer edge 312 of the magnet keeper first end 226, but the vector sum 340 may also change depending on the longitudinal distance between the diffuser magnetic plate 210 and the magnet keeper first end 226. Thus, first magnet keeper first end 600 may have a larger diameter than second magnet keeper first end 608; however, since the first magnet keeper first end 600 may be spaced farther apart from the diffuser magnetic plate 210, the ratio between the first longitudinal component 602 and the first transverse component 604 of the first vector sum 606 is actually greater than the ratio of the components of the second vector sum 610. Likewise, the ratio of the components of the second vector sum 610 may be greater than the ratio of the components of the third vector sum 614 even though a diameter of the second magnet keeper first end 608 may be greater than a diameter of the third magnet keeper first end 612.

Figure 7:
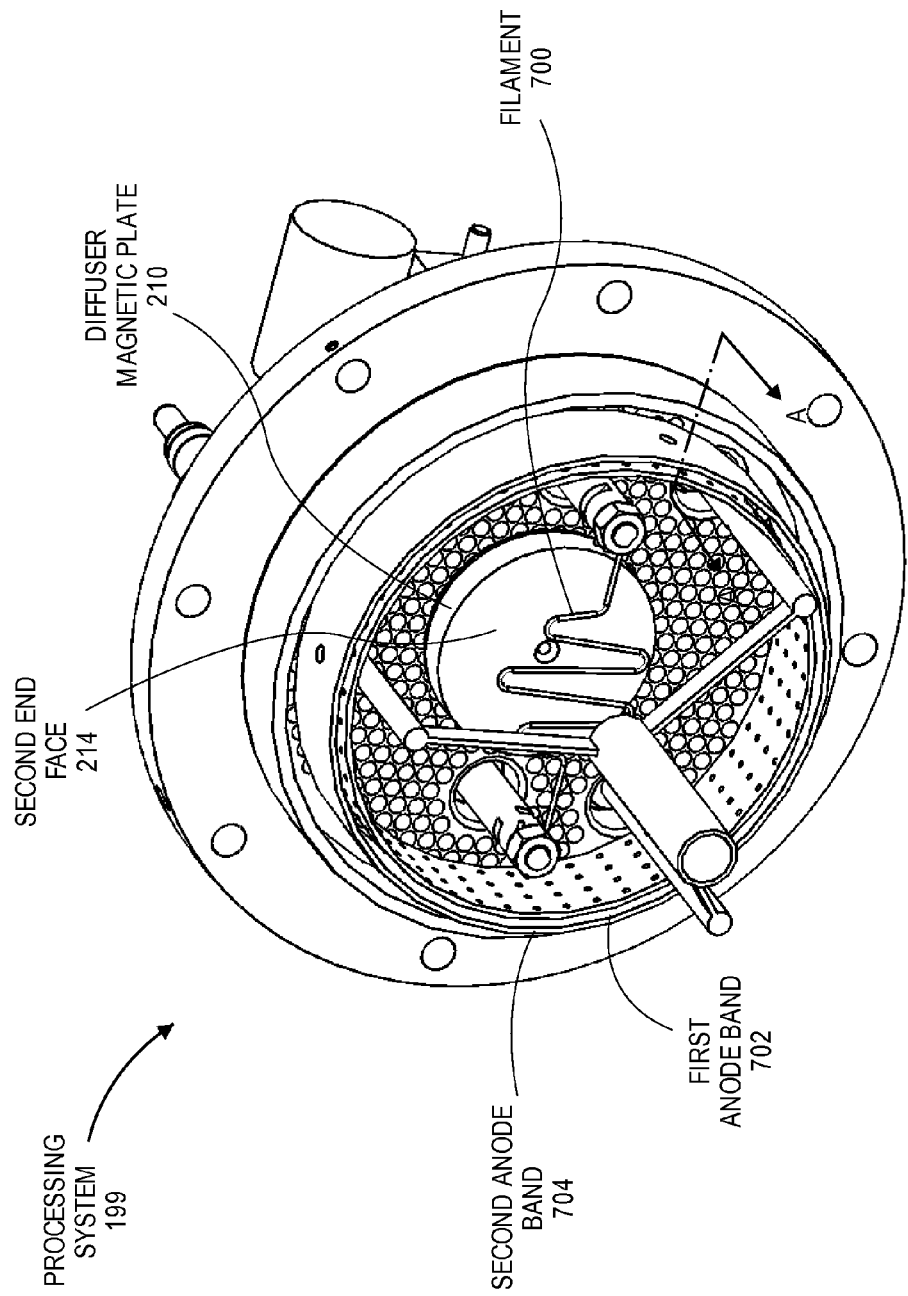
FIG. 7 is a partial perspective view illustrating a processing system according to one embodiment.

FIG. 7 is a partial perspective view illustrating some components of a processing system according to one embodiment of the present invention. The view of FIG. 7 is directed toward the second end face 214 of the diffuser magnetic plate 210 through the process chamber 200. The process chamber 200 includes an filament 700 that may be disposed in front of the diffuser magnetic plate 210. A dual anode may be disposed around the filament 700 and diffuser magnetic plate 210. The dual anode may include a first anode band 702 and a second anode band 704. The filament 700 and diffuser magnetic plate 210 may not be fully surrounded by either the first anode band 702 or the second anode band 704. Neither the first anode band 702 nor the second anode band 704 need be longitudinally aligned with the filament 700 or diffuser magnetic plate 210. However, the first anode band 702 and second anode band 704 may be transversely offset from the filament 700 and diffuser magnetic plate 210 such that an electron 1000 generated by the filament 700 will travel toward the anode bands through the process chamber 200. In one embodiment, the profiles of the anode bands may be longitudinally spaced apart from the filament 700 by a distance in a range of about 0.05 to 0.20 inch. In a particular embodiment, the profiles of the anode bands may be longitudinally spaced apart from the filament 700 by a distance of 0.07 inch. In another alternative embodiment, the profiles of the anode bands and the diffuser magnetic plate 210 may overlap by distance in a range of about 0.05 to 0.2 inch in the longitudinal direction. In one particular embodiment, the profiles of the anode bands and the diffuser magnetic plate 210 may overlap by a distance of 0.1 inch in the longitudinal direction.

Figure 8:
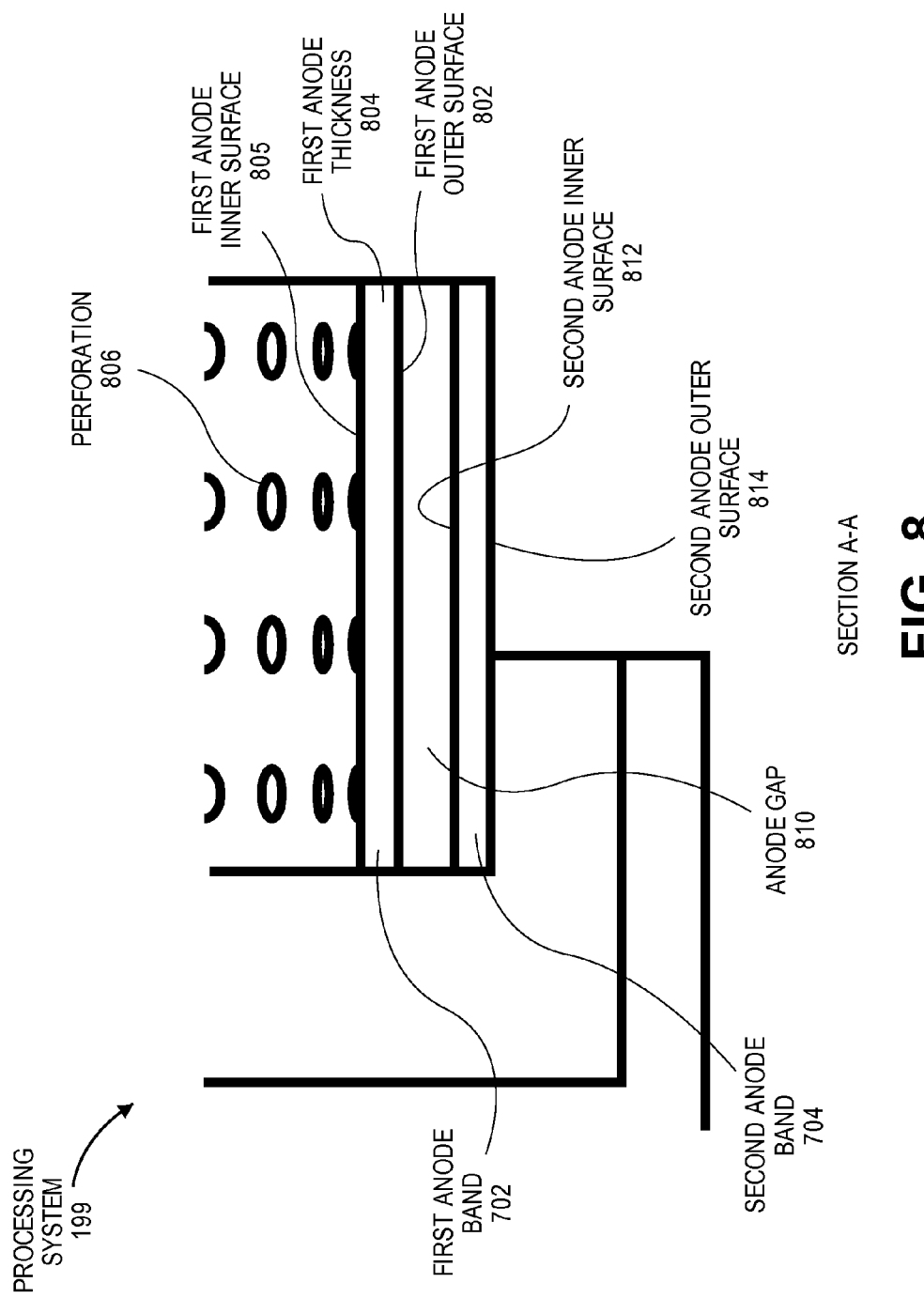
FIG. 8 is a partial cross-section view taken about section line A-A of FIG. 7 illustrating a processing system according to one embodiment.

FIG. 8 is a partial cross-sectional view taken about section line A-A of FIG. 7. The first anode band 702 includes a first anode inner surface 805 disposed nearer to the filament 700 (not shown) than the first anode outer surface 802. A first anode thickness 804 may exist between the first anode inner surface 800 and the first anode outer surface 802. A perforation 806 may be formed through the first anode thickness 804, thereby providing a line of sight between the filament 700 and the second anode band 704.

The second anode band 704 may be disposed about at least a portion of the first anode band 702 and may be offset from the first anode band 702 in a generally transverse direction by an anode gap 810. The anode gap 810 may exist between the first anode outer surface 802 and a second anode inner surface 812. The anode gap may vary in accordance with an embodiment of the invention, but in at least one embodiment the anode gap 810 may be in a range of 0.03 to 0.25 inches. Alternatively, the anode gap may 810 be in a range of 0.06 to 0.19 inches. The second anode band 704 may include a second anode inner surface 812 disposed nearer to the filament 700 than a second anode outer surface 814.

The first and second anode bands 702, 704, may be formed from any conductive material with a low magnetic permeability. For example, the anode bands 702, 704, may be formed from a 300 series stainless steel. Alternatively, the anode bands 702, 704, may be formed from other substantially non-magnetic materials such as molybdenum, titanium, or aluminum.

Figure 9:
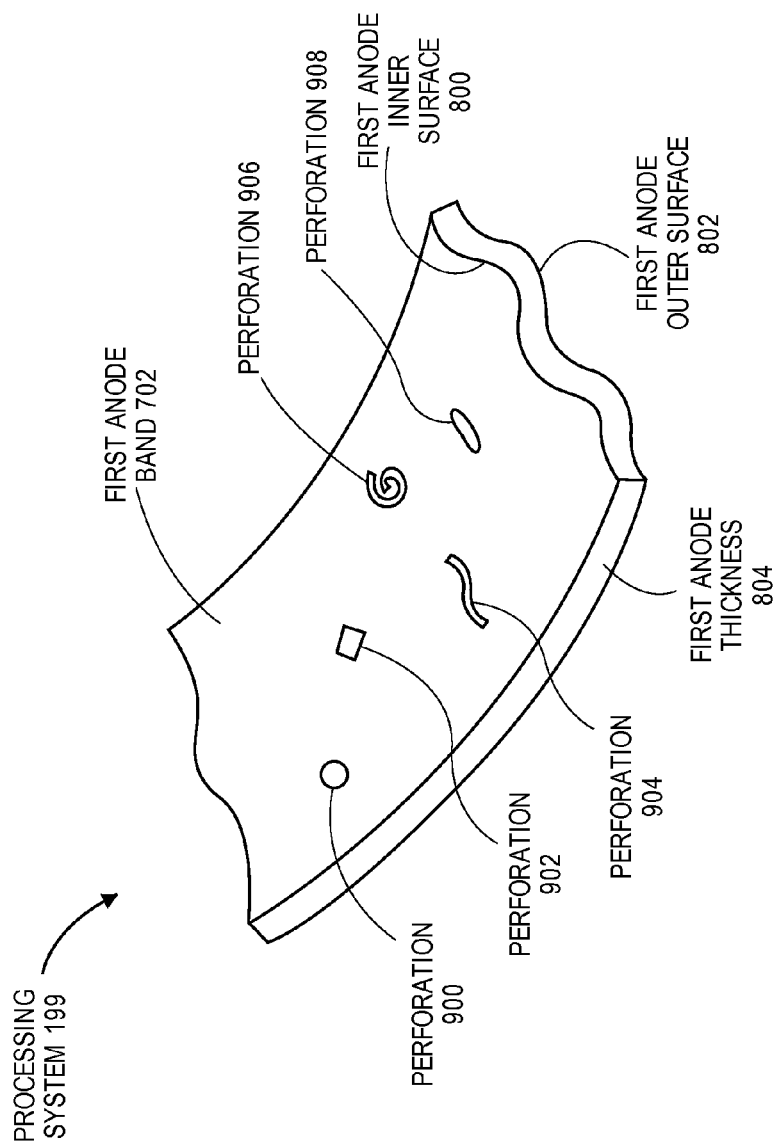
FIG. 9 illustrates embodiments of perforations in an anode band of the processing system.

FIG. 9 illustrates embodiments of perforations in anode band of the processing system. The perforation 806 in the first anode band 702 may be formed with any number of cross-sectional geometries. For example, the perforation 806 of FIG. 8 may be formed to include a circular cross-sectional geometry 900. Alternatively, the perforation may include a rectangular cross-sectional geometry 902, or the perforation may include an arcuate cross-sectional geometry 904, or the perforation may include a spiral cross-sectional geometry 906, or the perforation may include an elliptical cross-sectional geometry 908. In yet another embodiment, the perforations 806 of FIG. 8 may be louvers. The perforations 806 may be variously sized. For example, in one embodiment the perforations 806 may have an effective diameter in a range of 0.03 to 0.19 inches. In a particular embodiment, the perforation 806 may have an effective diameter of 0.06 inch. The perforation 806 may be formed through the first anode band 702 using any number of well known fabrication processes such as: punching, drilling, laser ablation, machining, grinding, or any other fabrication process known to one skilled in the art.

Figure 10:
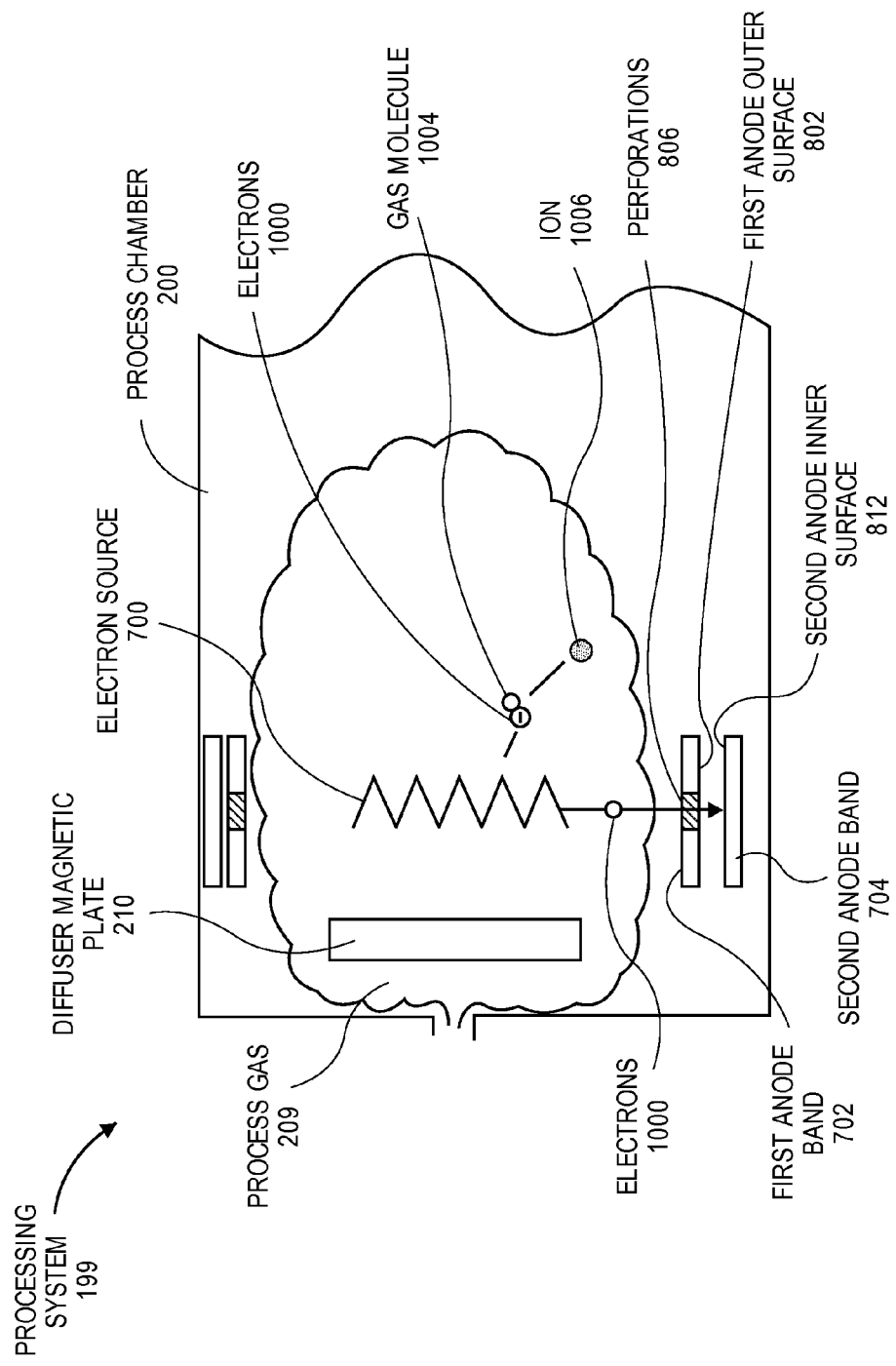
FIG. 10 is illustrates a method of operating a processing system according to one embodiment.

FIG. 10 illustrates a method of operating a processing system according to one embodiment. In operation of processing system 199, an electron 1000 is generated inside the process chamber 200 by energizing the filament 700 and one or more of the anode bands. The anode bands are charged, for example, to an electrical potential of +60 volts. The difference in charge between the filament 700 and the anode bands permits electrons to emit from the filament 700 into the process chamber 200. A process gas 209 may be flowed into the process chamber 200 between the diffuser magnetic plate 210 and the source flange 202 (not shown). Process gas 209 may be a hydrocarbon gas, such as acetylene ($C_2H_2$) or ethylene ($C_2H_4$), and may be neutral as it enters the process chamber 200. Emitted electrons 1000 strike gas molecules 1004 within the process gas 209 and transfer sufficient energy to the gas molecules 1004 to ionize them, thereby producing ions 1006. These ions 1006 form a plasma within the process chamber 200, along with other gas molecules 1004.

Ions 1006 are preferably directed toward a substrate (not shown) disposed within the process chamber 200. In an embodiment, the substrate may be a media storage disk. The ions 1006 in the process chamber 200 may be shielded from the magnetic field generated by the diffuser magnet 314 to ensure that deposition of the ions 1006 onto the substrate surface occurs evenly. As described above, the magnetic field may be directed from the first pole 316 of the diffuser magnet 314 along the magnet axis 220 in the direction of the diffuser magnetic plate 210. The thickness of the diffuser magnetic plate 210, and the relation of the outer edge 312 of the diffuser magnetic plate 210 to the first magnet keeper 224 end may be sized and configured to promote shielding of the magnetic field from ions 1006 within the process chamber 200. The magnetic field may be redirected through the diffuser magnetic plate 210 in a substantially transverse direction. The magnetic field may exit the diffuser magnetic plate 210 near its outer edge 312 and travel into the magnet keeper 224. The magnetic field may be directed through the magnet keeper 224 and into the second pole 318 of the diffuser magnet 314. Thus, the magnetic field may be shielded from entering the process chamber 200 so that the magnetic field does not directly distort the ion distribution within the process chamber 200.

In another embodiment, chamber magnets (not shown) may be disposed near the outer walls of the process chamber 200. The chamber magnets may assist in maintaining effective ion distribution within the process chamber 200 because the chamber magnets provide a magnetic field that repels plasma electrons and ions 1006 to keep the electrons 1000 and ions 1006 away from the process chamber 200 walls. By shielding the magnetic field generated by the diffuser magnet 314 from entering the process chamber 200 as described above, this magnetic field may not overlap and distort the magnetic field generated by the chamber magnets. As a result, ions 1006 within the process chamber 200 may not be indirectly distorted by the magnetic field and may be deposited more evenly on the substrate, which may cause a reduction in carbon coating thickness variation on the substrate.

From the foregoing description of embodiments it will be appreciated that the shielding of magnetic field in accordance with the described embodiments may be accomplished through various modifications and alternative embodiments. For example, by changing the diffuser magnet 314 material or dimensions to result in a weaker magnetic field, the thickness of the diffuser magnetic plate 210 may be correspondingly reduced while effectively shielding the magnetic field and preventing distortion of an ion 1006 within the process chamber 200. Likewise, an increase in the distance between the diffuser magnet 314 and the diffuser magnetic plate 210 may be compensated for by adjusting the magnet keeper first end 226 to conform more closely to the outer edge 312 of the diffuser magnetic plate 210 in order to effectively shield the magnetic field from distorting an ion 1006 within the process chamber 200. Thus, effective shielding of an ion 1006 within the process chamber 200 from the magnetic field generated by the diffuser magnet 314 has a multifactorial dependency on the diffuser magnet 314 material and dimensions, the distance between the magnet and diffuser magnetic plate 210, the thickness of the diffuser magnetic plate 210, the shape and location of the magnet keeper 224, and the material choice for the diffuser magnetic plate 210 and the magnet keeper 224. As a result, an adjustment in any one of these factors may be compensated for by an adjustment in one or more of the other factors that affects shielding of ions 1006 within the process chamber 200. Such an adjustment may be made within the scope of the embodiments taught herein. Furthermore, such an adjustment may improve ion deposition and carbon coating variation on the substrate surface.

An embodiment of a method of maintaining the conductivity of PECVD source anodes is also provided. When an electron 1000 is emitted from the filament 700, the electron 1000 may be drawn to the surface of either the first anode band 702 or the second anode band 704. Over time, as electrons 1000 ionize gas molecules 1004 within the process chamber 200, the resulting ions 1006 may deposit onto the anode bands 702, 704, surface. The deposition of ions 1006 onto the anode band surface may produce a carbon coating, such as a DLC carbon coating, in the same manner that ion deposition onto the substrate surface may coat the substrate.

The dual anode band design including perforations 806 may improve the longevity of anode conductivity. When the carbon coating on an anode surface reaches a thickness of approximately 500 nm, the anode loses much of its conductivity and therefore slows the ionization process because the anode does not readily draw electrons 1000 from the filament 700. Carbon coating of the anode surface tends to occur on the first anode inner surface 800 more than on the second anode band 704 surface because the first anode band 702 shields ions 1006 from depositing onto the second anode band 704. Thus, the second anode band 704 remains substantially uncoated by carbon during the production cycle. As the first anode band 702 gains electrically insulating carbon coating, it loses conductivity. However, the second anode band 704 retains substantial conductivity throughout the production cycle because it remains substantially uncoated and may still be able to receive electrons 1000 that pass through the perforations 806 into the first anode band 702. An improvement in the longevity of anode conductivity may maintain the anode conductivity over a production cycle and thus maintain more consistent production of ions 1006. Ultimately, consistency in ion production may translate to more consistent ion deposition and carbon coating thickness over a production cycle because the ions 1006 will deposit onto the substrate 1201 at approximately the same rate throughout the production cycle.

Figure 11:
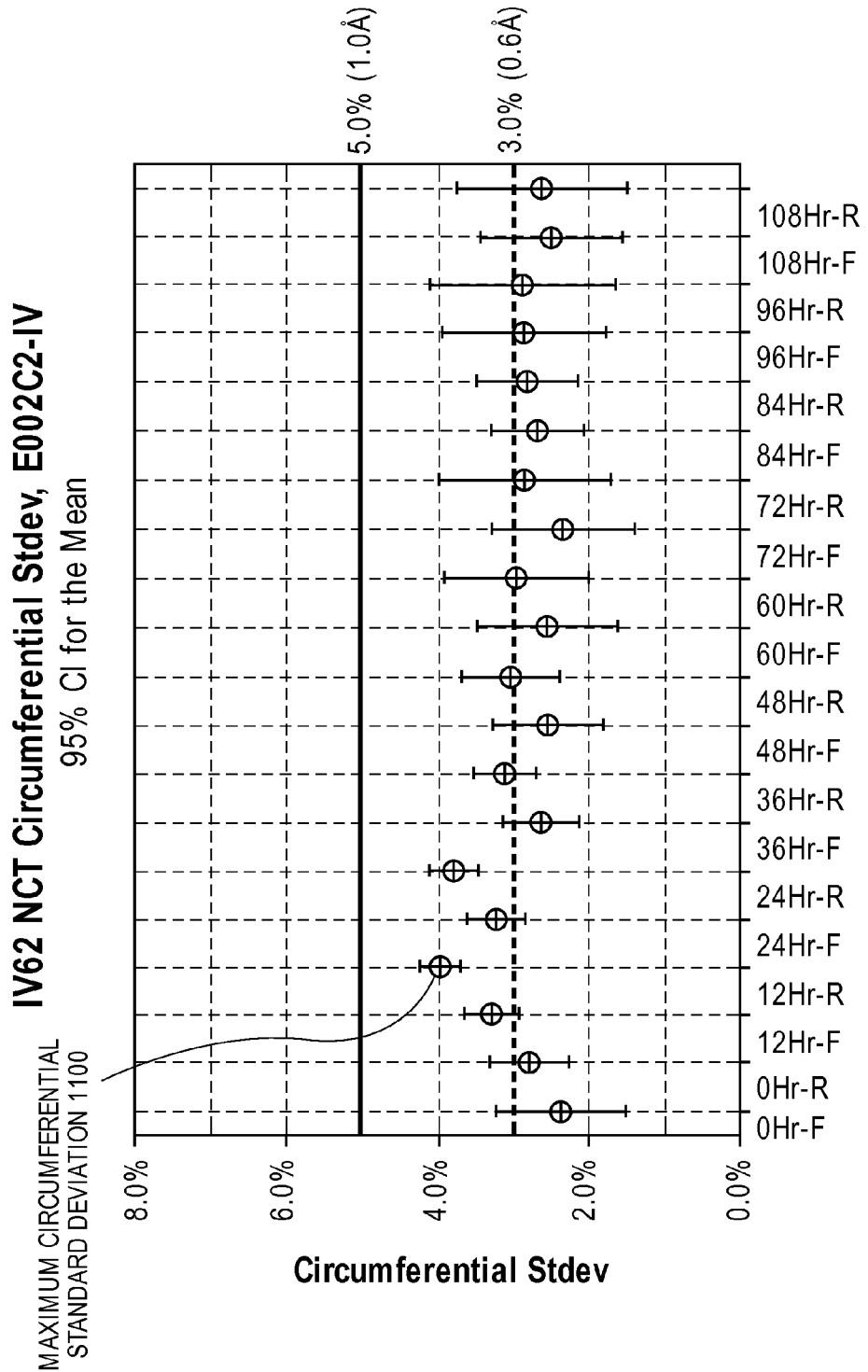
FIG. 11 is a plot illustrating carbon coating thickness variation for an embodiment of a processing system.

FIG. 11 is a plot illustrating carbon coating thickness variation for an embodiment of a processing system 199. The carbon coating thickness variation is represented as a circumferential standard deviation on a media storage disk that has been coated with carbon using a PECVD process. The PECVD process was performed using a processing system 199 according to an embodiment described above. The plotted circumferential standard deviation refers to the standard deviation of the carbon coating thickness as measured around the circumference of the media storage disk at the inner diameter, mean diameter, and outer diameter of the media storage disk. Media storage disk samples were measured throughout a 108 hour simulated production cycle, as shown by the horizontal time axis. The circumferential standard deviation of each measured sample was plotted against the vertical axis, which represents standard deviation as both a percentage of the nominal coating thickness and as an actual thickness. For example, the circumferential standard deviation of approximately 3.0% of nominal coating thickness measured at 48 hours into the production cycle corresponds to a total coating thickness variation of approximately 0.6 angstrom, given that the nominal coating thickness is approximately 20 angstroms.

Figure 1A:
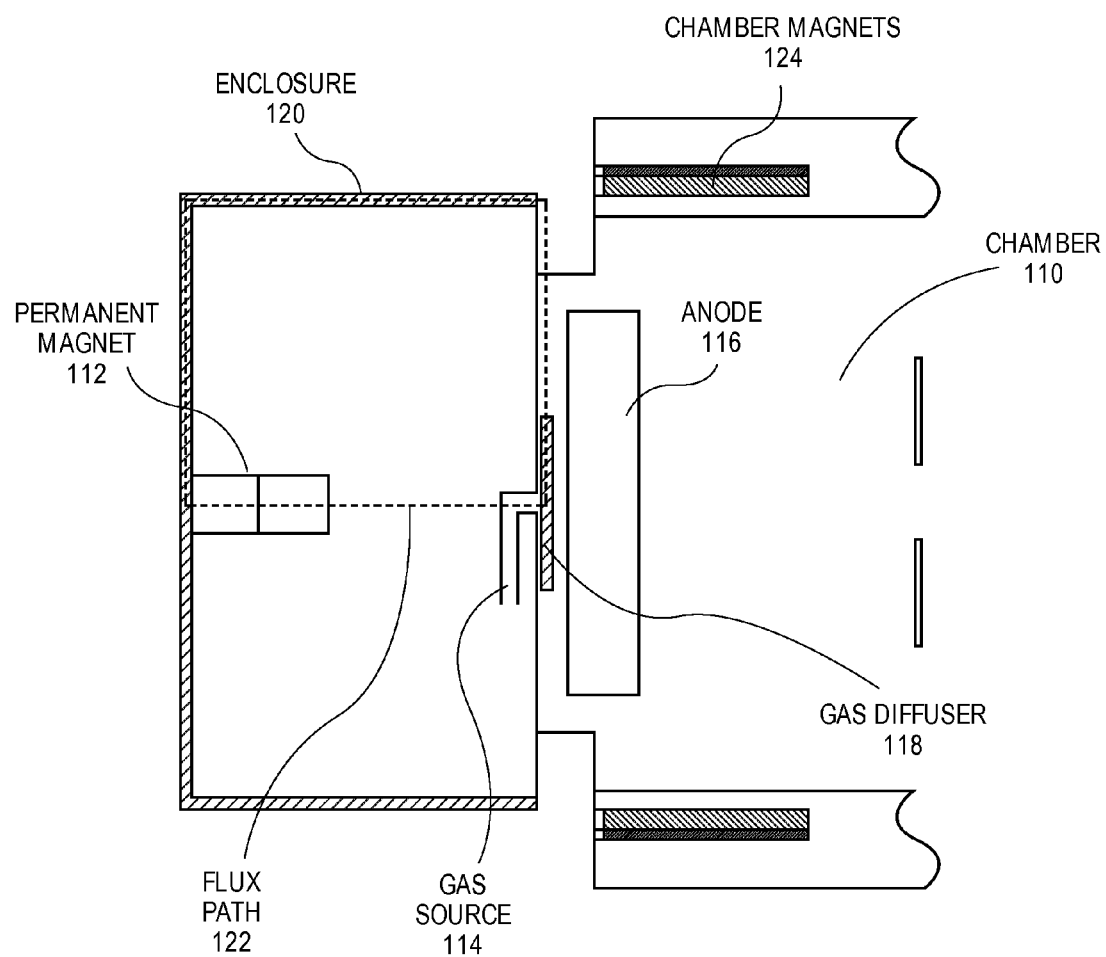
FIG. 1A is a partial plan view illustrating one type of processing system.
Figure 1B:
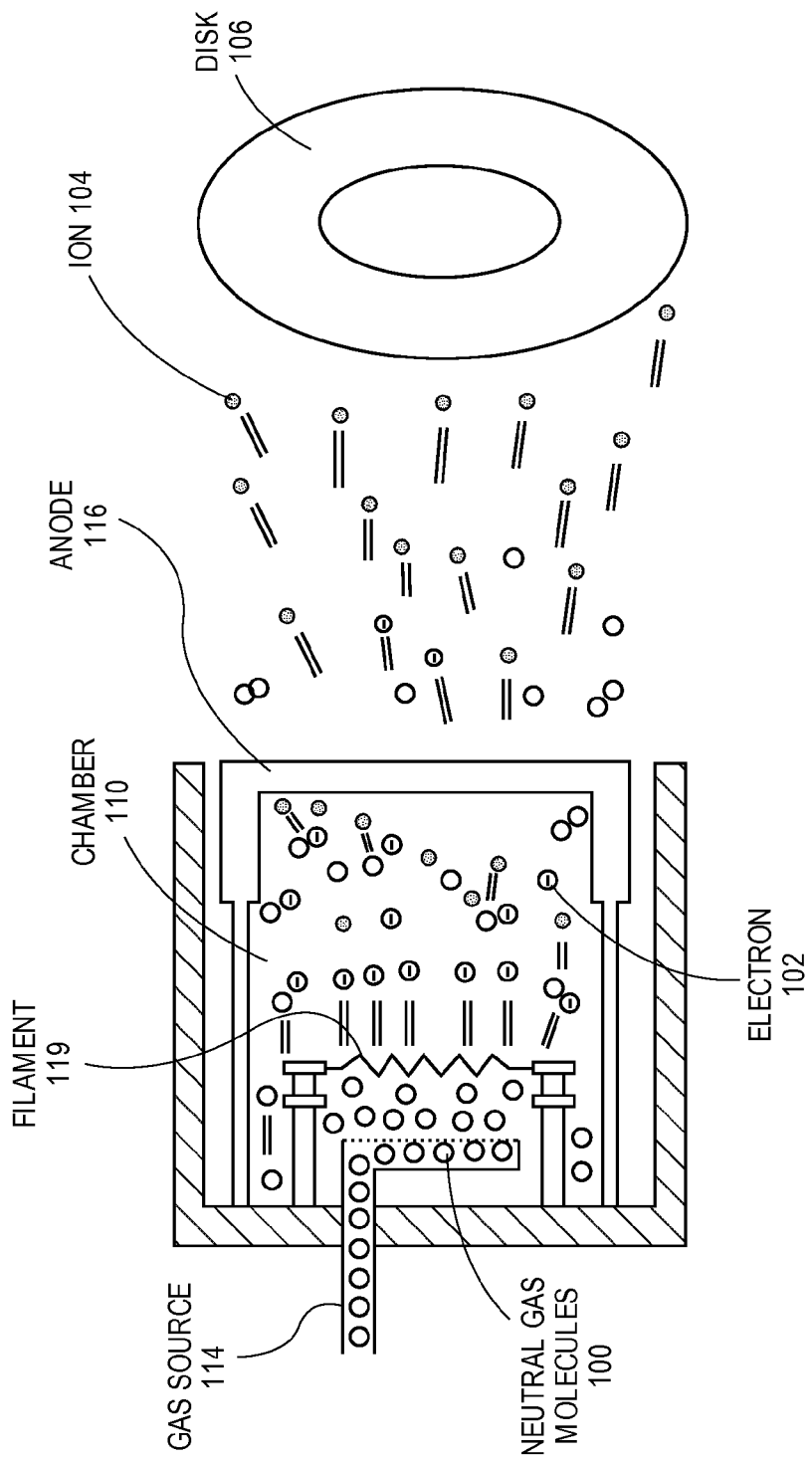
FIG. 1B is a diagram illustrating a conceptual operation of one type of processing system.
Figure 1C:
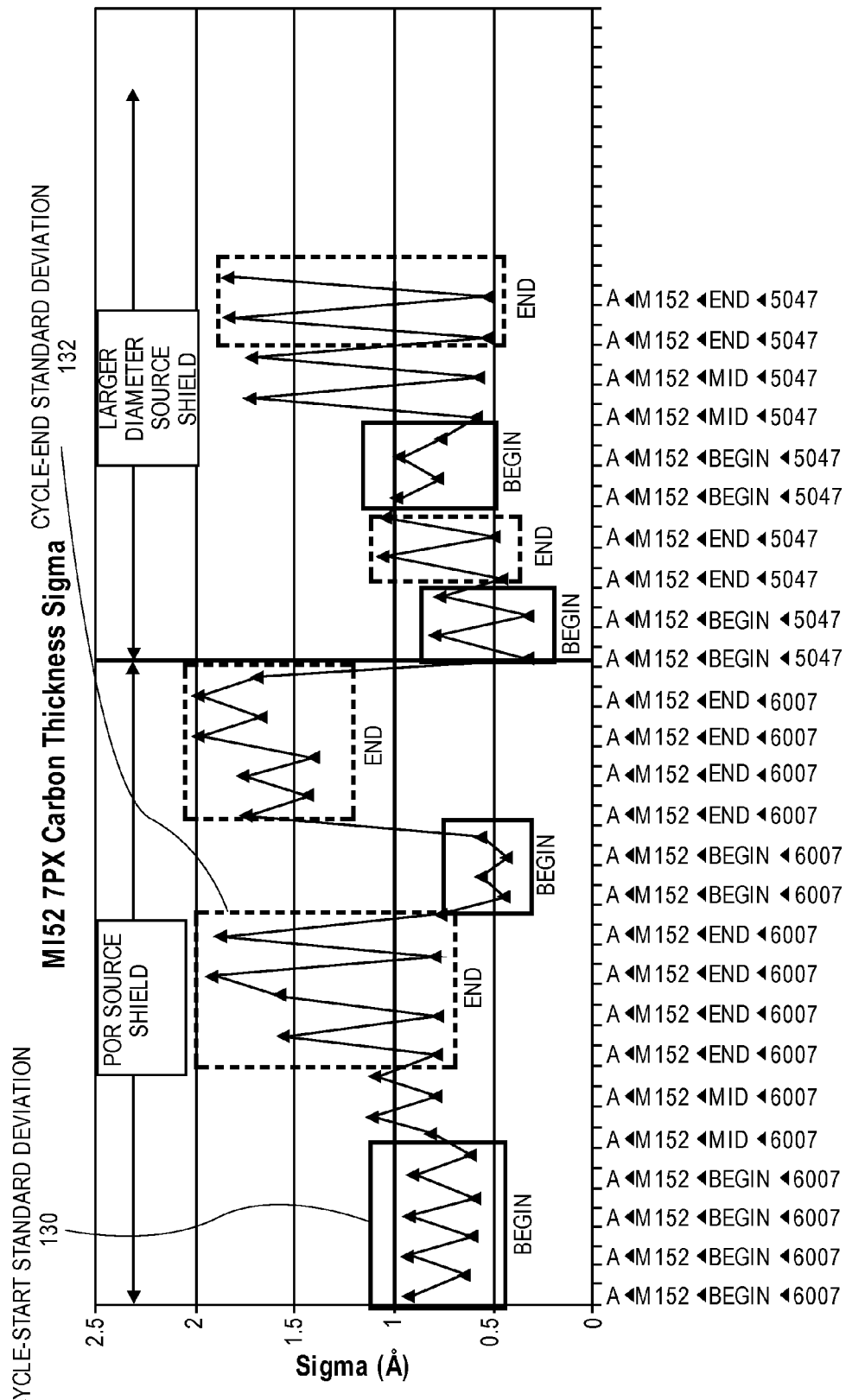
FIG. 1C is a plot illustrating coating thickness data for one type of processing system.

For a processing system 199 in accordance with an embodiment described above, the maximum circumferential standard deviation 1100 over a simulated production cycle is less than 1.0 angstrom, or 5.0% of the nominal coating thickness of 20 angstroms. This data compares favorably to the carbon coating thickness variation shown in FIG. 1C, which indicates that the maximum circumferential standard deviation 1100 may increase to a range of 2.0 to 2.5 angstroms using a processing system 199 that differs from the embodiments described herein. Thus, the processing system 199 embodiments described above provide a means for improving carbon coating thickness variation on a substrate. More particularly, the processing system 199 embodiments described above provide a means for reducing the carbon coating thickness variation on a substrate to a maximum circumferential standard deviation 1100 less than or equal to 2.4 angstroms over a production cycle.

Figure 12:
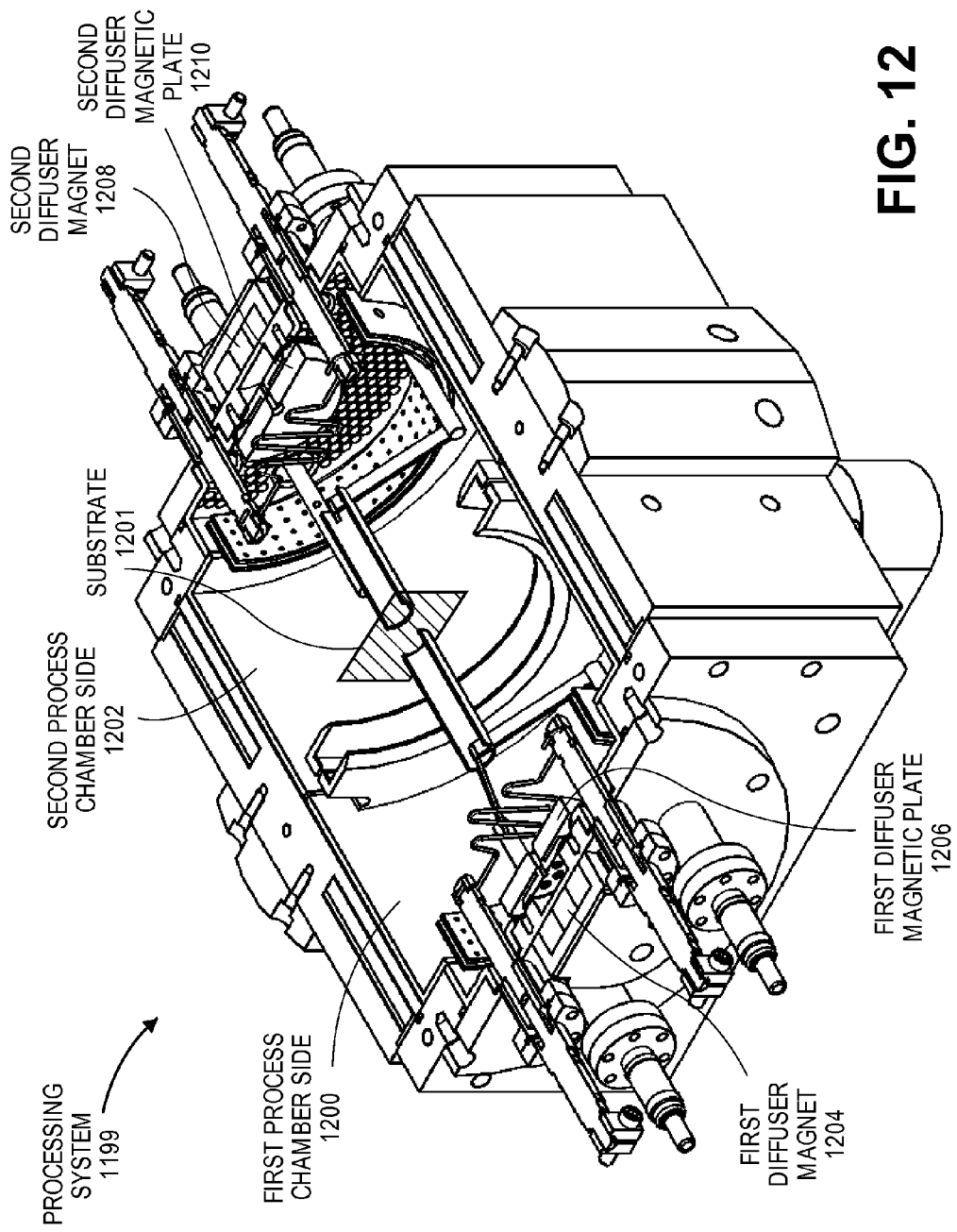
FIG. 12 is a partial plan, perspective view illustrating an alternative embodiment of a processing system.

FIG. 12 is a partial plan, perspective view illustrating an alternative embodiment of a processing system. The processing system 1199 includes at least two processing sides that allows multiple sides of a substrate to be processed at once by providing that ions 1006 may be directed to either side of the substrate. Thus, such an embodiment may be useful for coating both sides of a magnetic recording disk with a carbon coating. The processing system 1199 includes a first process chamber side 1200 and a second process chamber side 1202. The substrate may be generally disposed between the process chamber sides. In accordance with the processing system 1199 embodiments described above, the first process chamber side 1200 may include a first diffuser magnet 1204 and a first diffuser magnetic plate 1206 that enables shielding of ions 1006 produced within the first process chamber side 1200 from a magnetic field generated by the first diffuser magnet 1204. Likewise, ions 1006 produced within the second process chamber side 1202 may be shielded from a magnetic field generated by the second diffuser magnet 1208 by a second diffuser magnetic plate 1210.

The processing system 1199 illustrates that the embodiments described above are not limited to applications within processing systems that include a PECVD source, such as the PECVD system embodiments described herein. The benefits and advantages derived from the various embodiments of a processing system as described above may be applied to alternative substrate processing equipment. For example, the diffuser magnet, diffuser magnetic plate, magnet keeper, and the dual anode designs described herein may be applied to other processing systems that include a filament-type chemical vapor deposition (CVD) source.

In the foregoing specification, the present invention has been described with reference to specific exemplary embodiments thereof. It will, however, be evident that various modifications and changes may be made thereto without departing from the broader scope of the embodiments of the invention as set for in the appended claims. For example, although steps of embodiments of inventive methods may have been described in a specific order, one of skill in the art will understand that some of the steps described may occur simultaneously, in overlapping time frames, and/or in a different order from that described and claimed herein and fall within embodiments of the present invention. The specification and drawings are, accordingly, to be regarded in an illustrative rather than a restrictive sense.

What is claimed is:

1. A processing system, comprising:
a process chamber;
a diffuser magnet that is disposed outside the process chamber;
a diffuser magnetic plate disposed within the process chamber between an interior of the process chamber and the diffuser magnet, the diffuser magnetic plate being physically separate from the diffuser magnet;
a magnet field keeper partially enclosing the diffuser magnet; and
a cover partially enclosing the magnet field keeper and
the processing system further comprising:
a first anode band comprising: a first inner wall; a first outer wall offset from the first inner wall by a thickness; and a plurality of perforations formed through the first anode band; and
a second anode band surrounding the first anode band, the second anode band comprising a second inner wall offset from the first outer wall by a gap.

2. The processing system of claim 1, wherein the diffuser magnet is a permanent magnet.

3. The processing system of claim 2, wherein the diffuser magnet is formed from a material selected from the group consisting of neodymium-iron-boron alloys, samarium-cobalt alloys, ceramics, hard ferrites, and aluminum-nickel-cobalt alloys.

4. The processing system of claim 2, wherein the diffuser magnet is formed from a material comprising Ceramic 8.

5. The processing system of claim 2, wherein the diffuser magnet has a maximum energy product less than or equal to 40 MGOe.

6. The processing system of claim 1, wherein the diffuser magnet has an effective diameter in a range of 0.2 to 1.0 inches.

7. The processing system of claim 1, wherein the diffuser magnet has a length in a range of 0.3 to 1.0 inches.

8. The processing system of claim 1, wherein the diffuser magnetic plate is formed from a soft magnetic material.

9. The processing system of claim 8, wherein the diffuser magnetic plate is formed from a material selected from the group consisting of steels, electrical steels, iron-nickel alloys, iron-cobalt alloys, ferrites, and amorphous metals.

10. The processing system of claim 8, wherein the diffuser magnetic plate is formed from a material comprising a relative permeability greater than or equal to the relative permeability of grade 410 stainless steel.

11. The processing system of claim 1, wherein the diffuser magnetic plate has a thickness in a range of 0.2 to 0.5 inches.

12. The processing system of claim 11, wherein the diffuser magnetic plate has a thickness of 0.35 inches.

13. The processing system of claim 1, wherein the magnet field keeper is formed from a soft magnetic material.

14. The processing system of claim 13, wherein the magnet keeper is formed from a material selected from the group consisting of steels, electrical steels, iron-nickel alloys, iron-cobalt alloys, ferrites, and amorphous metals.

15. The processing system of claim 13, wherein the magnet field keeper is formed from a material comprising a relative permeability greater than or equal to the relative permeability of grade 410 stainless steel.

16. The processing system of claim 1, wherein the diffuser magnet is disposed a distance from the diffuser magnetic plate in a range of 0.53 to 0.75 inches.

17. The processing system of claim 1, wherein the gap is in a range of 0.06 to 0.19 inches.

18. The processing system of claim 1, wherein the processing system is a plasma enhanced chemical vapor deposition system.

* * * * *